United States Patent
Sun et al.

(10) Patent No.: US 10,756,686 B2
(45) Date of Patent: Aug. 25, 2020

(54) BAND SHARING TECHNIQUE OF RECEIVER

(71) Applicant: MEDIATEK INC., Hsin-Chu (TW)

(72) Inventors: Chih-Hao Sun, Hsin-Chu (TW); Yu-Tsung Lo, Hsin-Chu (TW); Yi-Bin Lee, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/595,498

(22) Filed: Oct. 8, 2019

(65) Prior Publication Data
US 2020/0144975 A1  May 7, 2020

Related U.S. Application Data

(60) Provisional application No. 62/756,611, filed on Nov. 7, 2018.

(51) Int. Cl.
| | | |
|---|---|---|
| *H04B 1/10* | (2006.01) | |
| *H04B 1/16* | (2006.01) | |
| *H03F 3/193* | (2006.01) | |
| *H03F 3/72* | (2006.01) | |
| *H03D 7/14* | (2006.01) | |

(52) U.S. Cl.
CPC .......... *H03F 3/193* (2013.01); *H03D 7/1441* (2013.01); *H03D 7/1458* (2013.01); *H03F 3/72* (2013.01); *H03F 2200/294* (2013.01); *H03F 2200/372* (2013.01); *H03F 2200/451* (2013.01)

(58) Field of Classification Search
CPC .......... H04B 1/005; H04B 1/006; H04B 1/06; H04B 1/10; H04B 1/16
See application file for complete search history.

(56) References Cited

U.S. PATENT DOCUMENTS

| | | | |
|---|---|---|---|
| 5,483,696 | A | 1/1996 | Wheatley, III et al. |
| 6,026,286 | A | 2/2000 | Long |
| 6,275,687 | B1 | 8/2001 | Lloyd |
| 6,889,037 | B2 | 5/2005 | Darabl |

(Continued)

FOREIGN PATENT DOCUMENTS

| | | |
|---|---|---|
| EP | 0 917 297 A2 | 5/1999 |
| EP | 0 917 297 A3 | 3/2003 |
| EP | 1 394 957 A1 | 3/2004 |

OTHER PUBLICATIONS

Tzung-Han Wu, "A 40nm 4-downlink and 2-uplink RF Transceiver Supporting LTE-Advanced Carrier Aggregation", 2018 IEEE Radio Frequency Integrated Circuits Symposium.

*Primary Examiner* — Blane J Jackson
(74) *Attorney, Agent, or Firm* — Winston Hsu

(57) ABSTRACT

The present invention provides a receiver including a first band group, a second band group and a mixer. The first band group includes at least one LNA, wherein the first band group is configured to select one first LNA to receive a first input signal to generate an amplified first input signal. The second band group includes at least one LNA, wherein the second band group is configured to select one second LNA to receive a second input signal to generate an amplified second input signal. The first band group and the second band group are coupled to a first input terminal and a second input terminal of the mixer, respectively, and the mixer receives one of the amplified first input signal and the amplified second input signal to generate an output signal.

12 Claims, 7 Drawing Sheets

(56) References Cited

U.S. PATENT DOCUMENTS

| | | |
|---|---|---|
| 7,046,068 B2 | 5/2006 | Chiu et al. |
| 7,532,055 B2 | 5/2009 | Chiu et al. |
| 7,551,910 B2 | 6/2009 | Darabi |
| 7,639,311 B2 * | 12/2009 | Tai .......................... H03F 3/72 348/725 |
| 7,647,026 B2 | 1/2010 | Darabi |
| 8,218,693 B2 | 7/2012 | Darabi |
| 8,577,322 B1 * | 11/2013 | Jin ....................... H03D 7/1425 331/117 R |
| 8,626,084 B2 | 1/2014 | Chan et al. |
| 8,660,041 B2 | 2/2014 | Niskanen et al. |
| 8,963,610 B2 * | 2/2015 | Mishra ..................... G06G 7/12 327/355 |
| 9,154,179 B2 | 10/2015 | Gudem et al. |
| 9,548,709 B2 | 1/2017 | Aparin |
| 9,948,239 B2 * | 4/2018 | Choi ....................... H04B 1/109 |
| 2009/0088124 A1 | 4/2009 | Schuur |
| 2010/0308916 A1 * | 12/2010 | Lee ...................... H03G 1/0023 330/278 |

* cited by examiner

BAND SHARING TECHNIQUE OF RECEIVER

CROSS REFERENCE TO RELATED APPLICATIONS

This application claims the priority of U.S. Provisional Application No. 62/756,611, filed on Nov. 7, 2018, which is included herein by reference in its entirety.

BACKGROUND

In the conventional receiver, each band group needs a dedicated mixer and operates independently. To decrease the chip area, some mixer sharing techniques are provided. In a first example, two band groups are coupled to an input terminal of the mixer via switches, respectively, and only one of the band groups is allowed to connect to the input terminal of the mixer at the same time. However, the switches of the first example provide additional parasitic load, and the input terminal of the mixer will see the parasitic load of two switches. In a second example, two band groups are directly connected to the input terminal of the mixer, and only one of the band groups is enabled to transmit a signal to the input terminal of the mixer at the same time. However, the load of the band groups needs to be co-designed, and the input terminal of the mixer will see the parasitic load of two band groups, causing a worse performance of the receiver.

SUMMARY

It is therefore an objective of the present invention to provide a band sharing technique, wherein the mixer shared by two band groups has lower load at the input terminal, to solve the above-mentioned problem.

According to one embodiment of the present invention, a receiver comprising a first band group, a second band group and a mixer is provided. The first band group comprises at least one first low-noise amplifier (LNA), wherein the first band group is configured to select one first LNA to receive a first input signal to generate an amplified first input signal. The second band group comprises at least one second LNA, wherein the second band group is configured to select one second LNA to receive a second input signal to generate an amplified second input signal. The first band group and the second band group are coupled to a first input terminal and a second input terminal of the mixer, respectively, and the mixer receives one of the amplified first input signal and the amplified second input signal to generate an output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
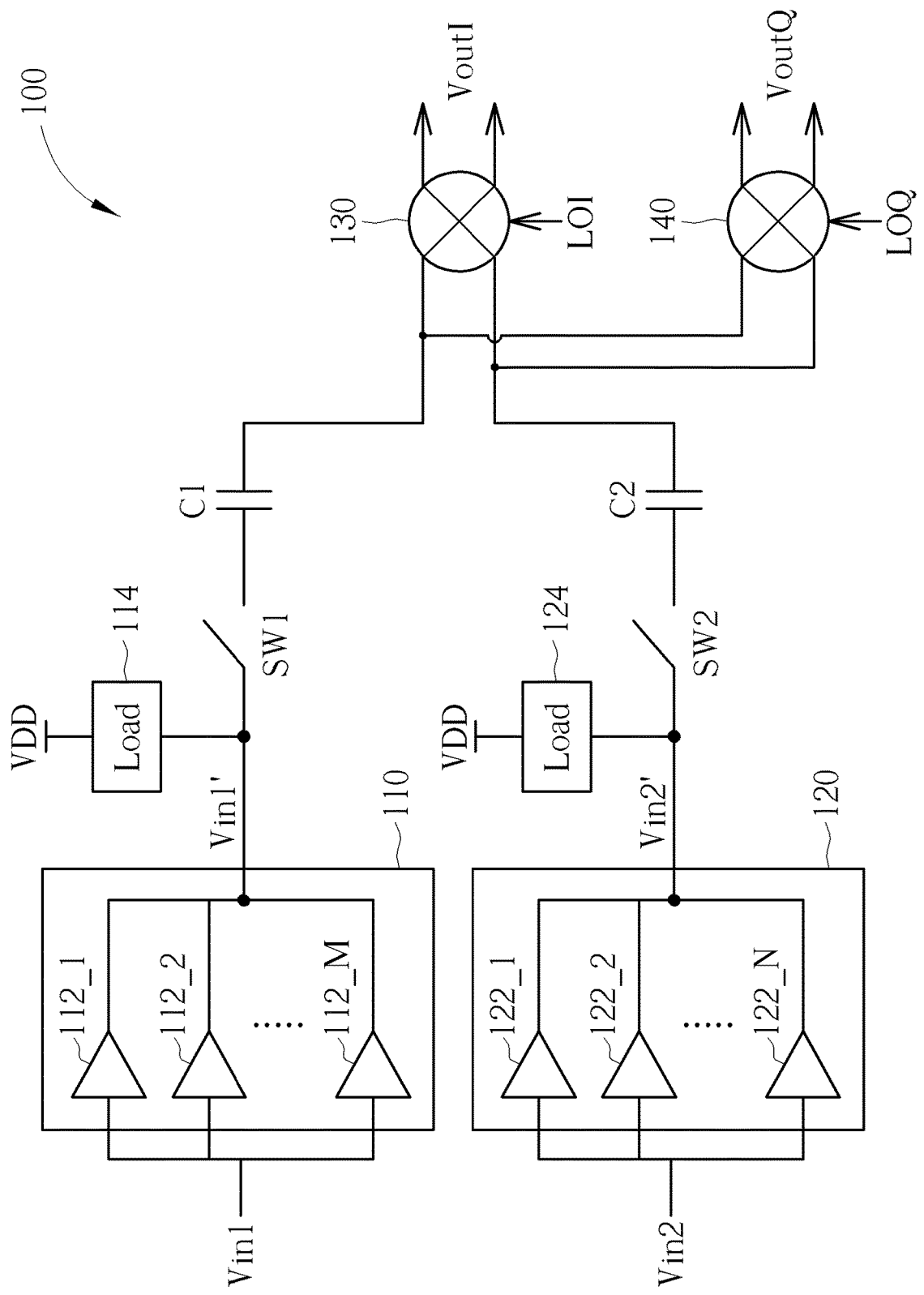
FIG. 1 is a diagram illustrating a receiver according to one embodiment of the present invention.

FIG. 1 is a diagram illustrating a receiver 100 according to one embodiment of the present invention. As shown in FIG. 1, the receiver 100 comprises a first band group 110, a second band group 120 and double balanced mixers 130 and 140, wherein the first band group 110 comprises at least one LNA (in this embodiment, the first band group 110 comprises a plurality of LNAs 112_1-112_M), and the second band group 120 comprises at least one LNA (in this embodiment, the second band group 120 comprises a plurality of LNAs 122_1-122_N), and M and N can be any suitable values. In addition, the first band group 110 has a first load 114 at an output terminal, and a first switch SW1 and a first capacitor C1 are coupled between the first band group 110 and first input terminals of the double balanced mixers 130 and 140; and the second band group 120 has a second load 124 at an output terminal, and a second switch SW2 and a second capacitor C2 are coupled between the second band group 120 and second input terminals of the double balanced mixers 130 and 140.

Figure 2:
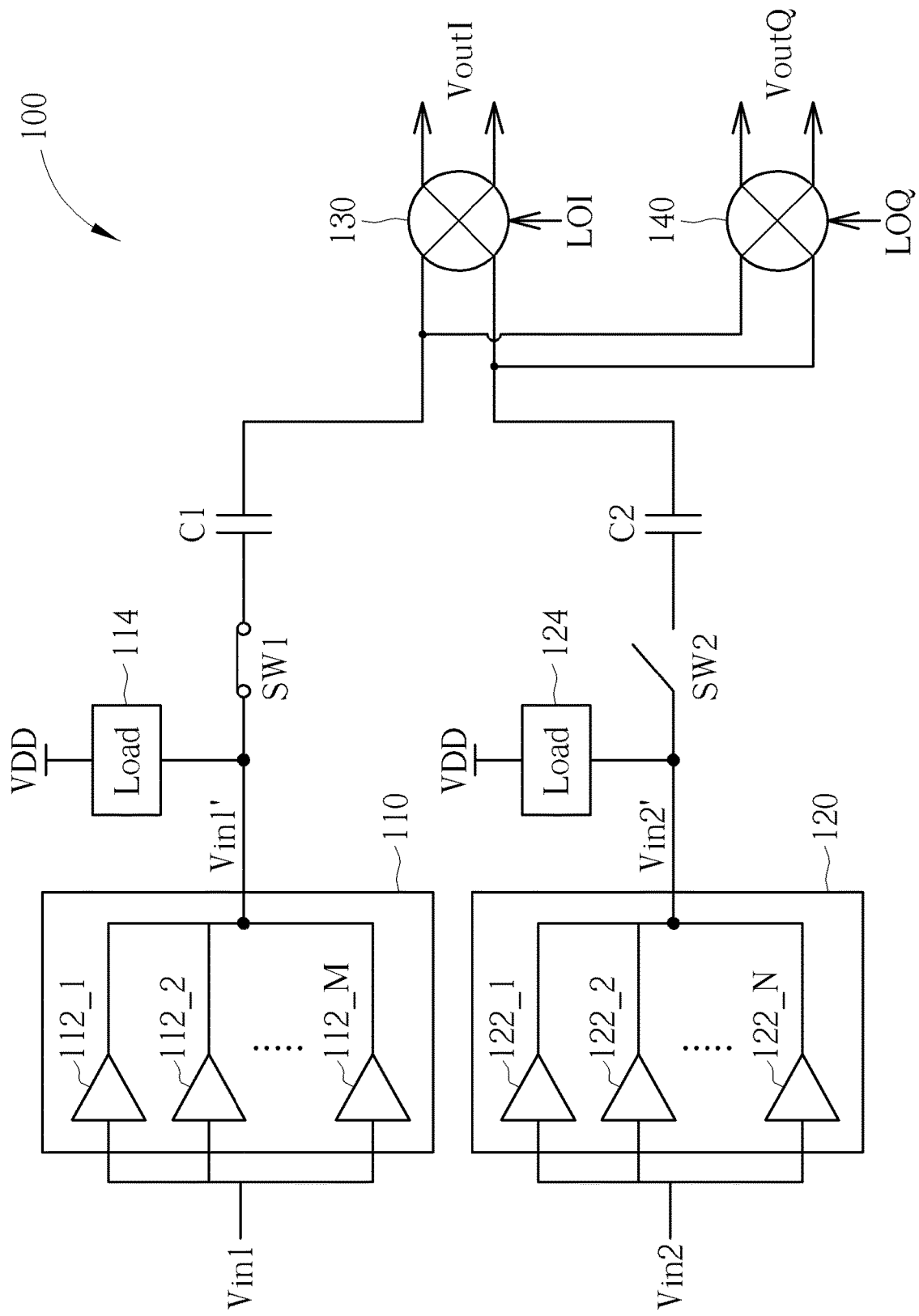
FIG. 2 shows that the first band group is selected in the receiver shown in FIG. 1.

In the operations of the receiver 100, only one of the first band group 110 and the second band group 120 is selected to connect to the double balanced mixer 130. When the first band group 110 is selected as shown in FIG. 2, the first switch SW1 is on and the second switch SW2 is off, and the first band group 110 selects one of the LNAs 112_1-112_M to receive a first input signal Vin1 to generate an amplified first input signal Vin1', and the amplified first input signal Vin1' passes through the first switch SW1 and the first capacitor C1 to the first input terminal of the double balanced mixer 130, and the double balanced mixer 130 mixes the amplified first input signal Vin1' with an oscillation signal LOI to generate an output signal VoutI; in addition, the double balanced mixer 140 mixes the amplified first input signal Vin1' with an oscillation signal LOQ to generate an output signal VoutQ. In addition, when the second band group 120 is selected as shown in FIG. 3, the second switch SW2 is on and the first switch SW1 is off, and the second band group 120 selects one of the LNAs 122_1-122_N to receive a second input signal Vin2 to generate an amplified second input signal Vin2', and the amplified second input signal Vin2' passes through the second switch SW2 and the second capacitor C2 to the second input terminal of the double balanced mixer 130, and the double balanced mixer 130 mixes the amplified second input signal Vin2' with the oscillation signal LOI to generate the output signal VoutI; and the double balanced mixer 140 mixes the amplified second input signal Vin2' with an oscillation signal LOQ to generate the output signal VoutQ.

Figure 3:
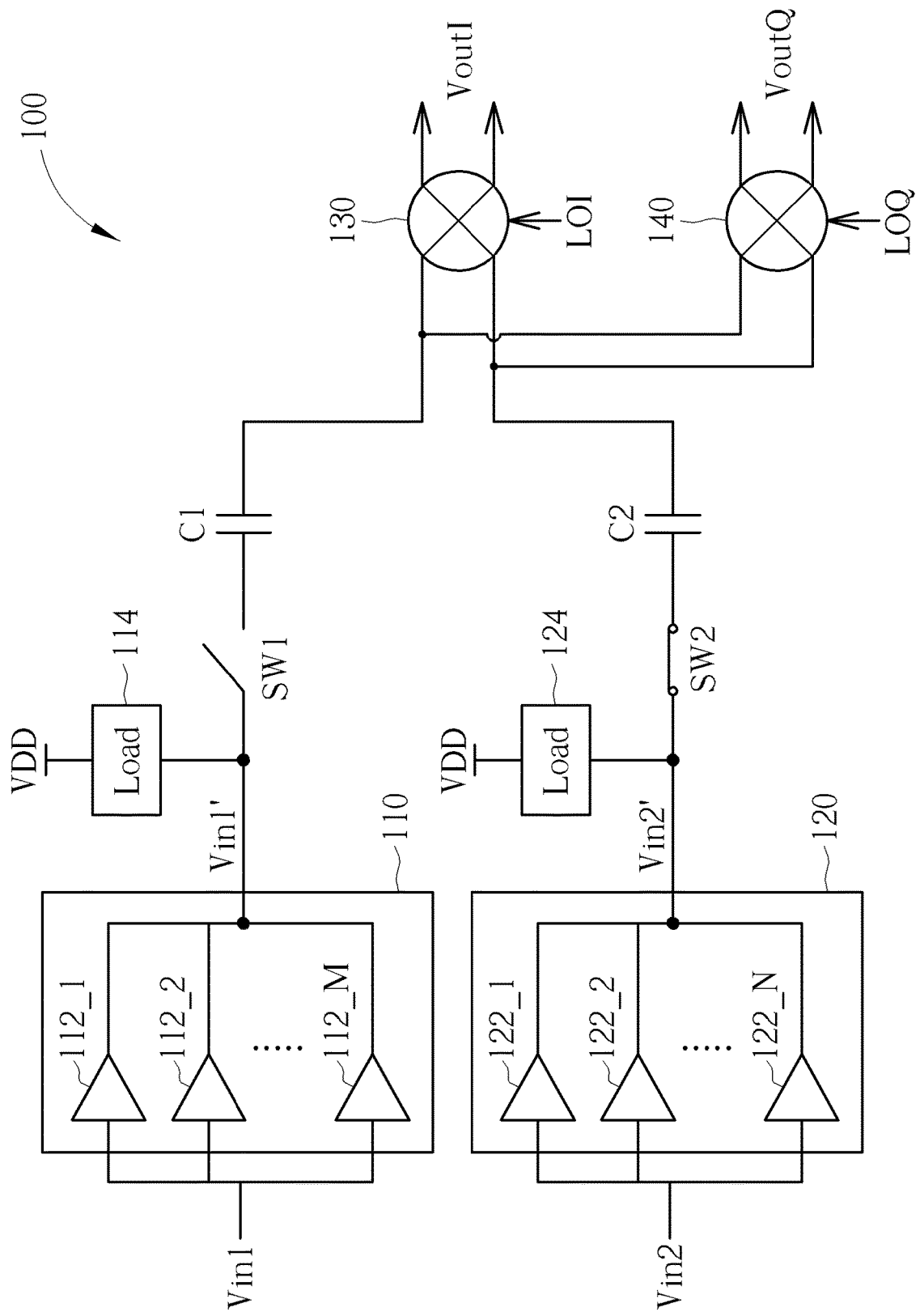
FIG. 3 shows that the second band group is selected in the receiver shown in FIG. 1.

In the embodiment shown in FIGS. 1-3, because each of the first band group 110 and the second band group 120 uses only one input terminal of the double balanced mixer 130 and only one input terminal of the double balanced mixer 140, each signal path always suffers the parasitic load of only one of the first switch SW1 and the second switch SW2. Therefore, the signal quality is better than the conventional art.

In addition, the capacitor C1 and the capacitor C2 are used to prevent the bias voltage of the LNAs 112_1-112_M or 122_1-122_N from being influenced by the bias voltage of the double balanced mixer 130, that is the receiver 100 has better in-band performance.

In another embodiment, the positions of the first switch SW1 and the first capacitor C1 can be interchanged, or the positions of the second switch SW2 and the second capacitor C2 can also be interchanged, in order to make the double balanced mixer 130 has less parasitic load at the input terminals (it is noted that the parasitic load of the switch is much less than that of the capacitor). Specifically, if the positions of the second switch SW2 and the second capacitor C2 are interchanged, when the first band group 110 is enabled and the second band group 120 is disabled, the second input terminal of the double balanced mixer 130 will see less parasitic load and the second switch SW2 provides higher impedance to the double balanced mixer 130, and the performance regarding the double balanced mixer 130 processing the amplified first input signal Vin1' will become better.

In light of above, because the positions of the first switch SW1 and the first capacitor C1 shown in FIGS. 1-3 makes the receiver 100 have better in-band performance, and the interchanged positions of the second switch SW2 and the second capacitor C2 favors the performance of the first band group 110, if the first band group 110 is more important than the second band group 120, the positions of the second switch SW2 and the second capacitor C2 shown in FIGS. 1-3 can be interchanged to increase the performance of the first band group 110.

Figure 4:
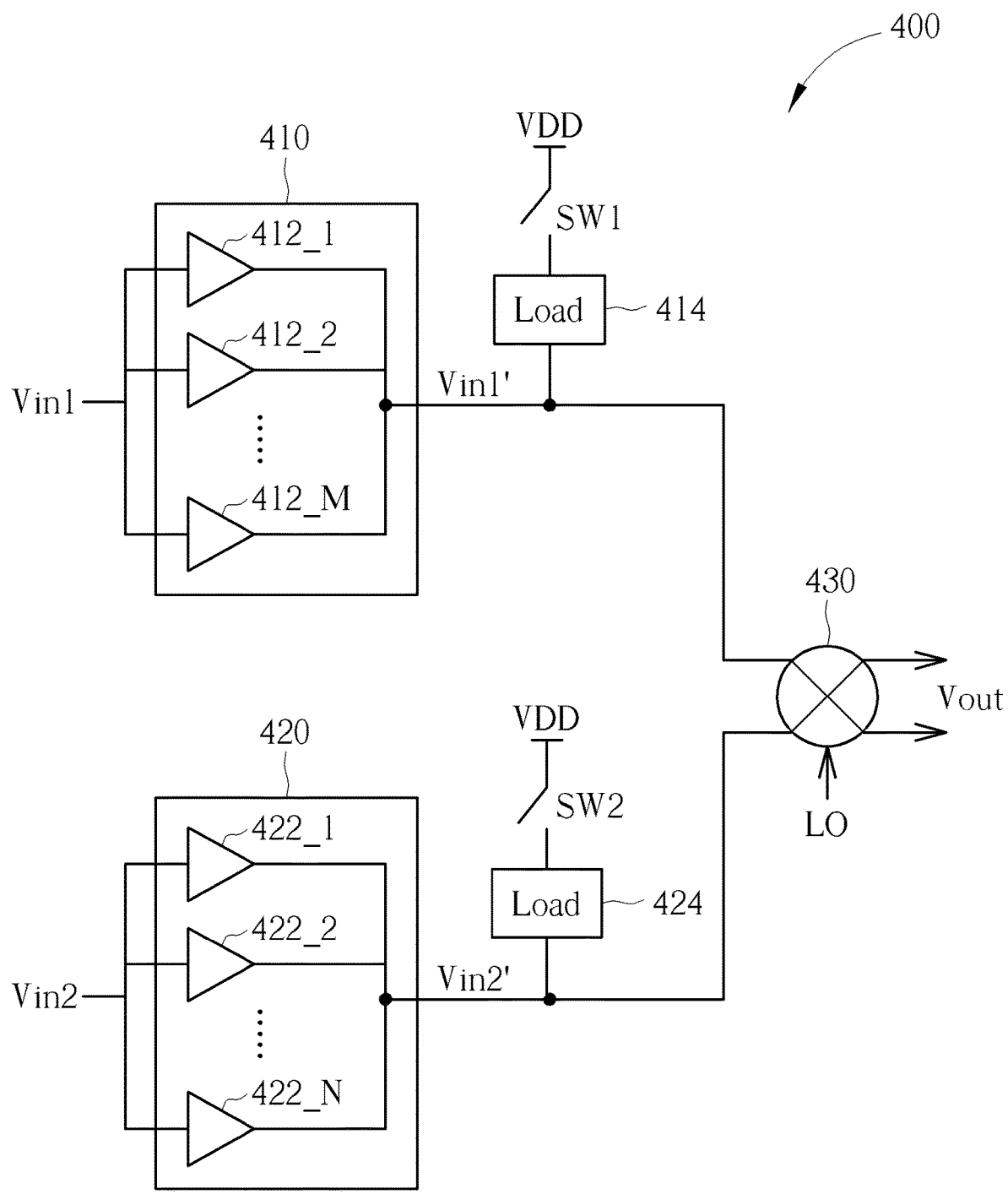
FIG. 4 is a diagram illustrating a receiver according to another embodiment of the present invention.

FIG. 4 is a diagram illustrating a receiver 400 according to another embodiment of the present invention. As shown in FIG. 4, the receiver 400 comprises a first band group 410, a second band group 420 and a double balanced mixer 430, wherein the first band group 410 comprises a plurality of LNAs 412_1-412_M, and the second band group 420 comprises a plurality of LNAs 422_1-422_N, and M and N can be any suitable values. In addition, the first band group 410 has a first load 414 at an output terminal, and a first switch SW1 is coupled between a supply voltage VDD and the output terminal of the first band group 410; and the second band group 420 has a second load 424 at an output terminal, and a second switch SW2 is coupled between the supply voltage VDD and the output terminal of the second band group 420. It is noted that the receiver 400 may further comprise another double balanced mixer as shown in FIG. 1, where the double balanced mixer 430 is configured to generate an in-phase output signal VoutI, and the other double balanced mixer is configured to generate a quadrature output signal VoutQ, which is similar to the embodiment shown in FIG. 1.

Figure 5:
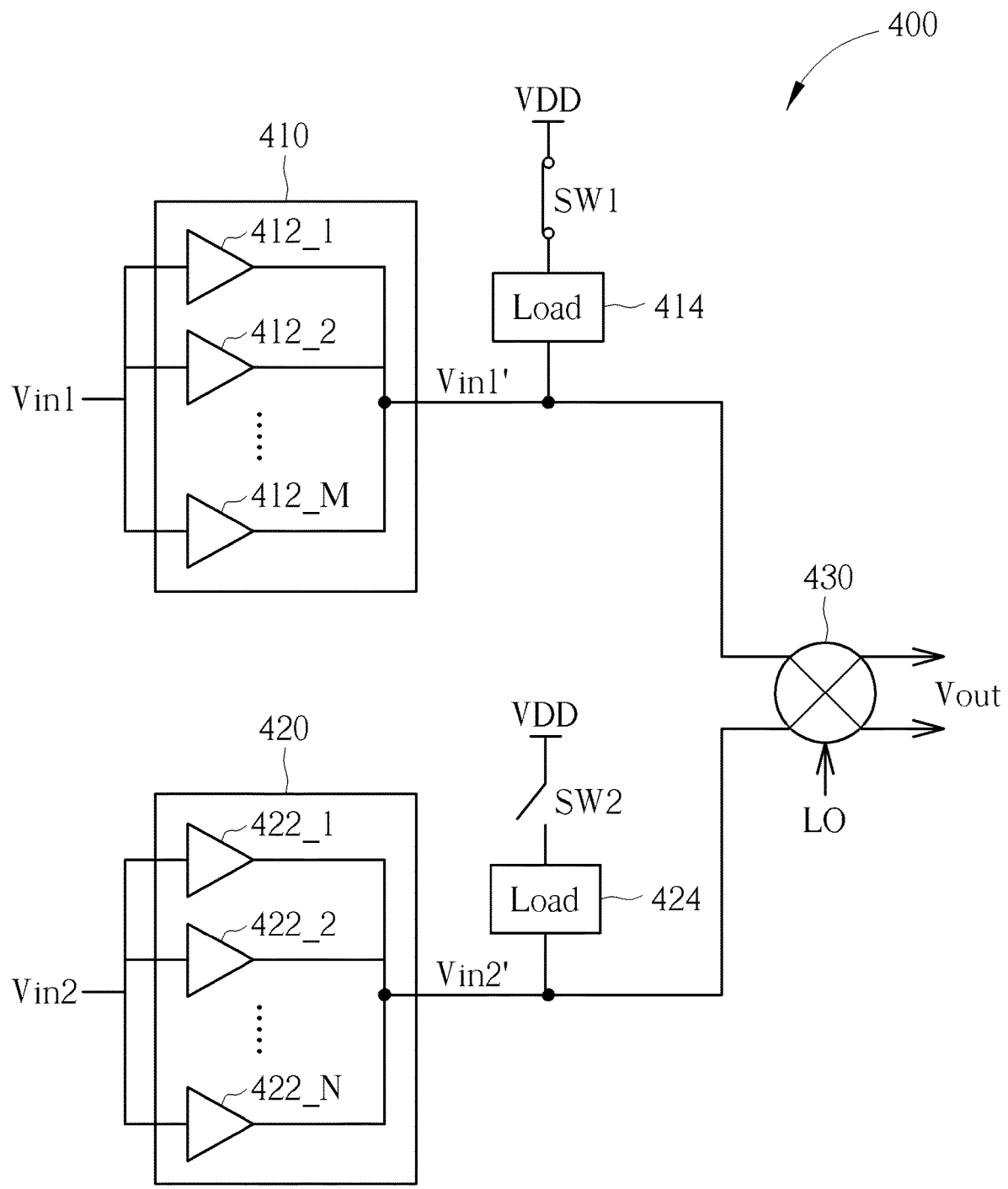
FIG. 5 shows that the first band group is selected in the receiver shown in FIG. 4.

In the operations of the receiver 400, only one of the first band group 410 and the second band group 420 are selected to connect to the double balanced mixer 430. When the first band group 410 is selected as shown in FIG. 5, the first switch SW1 is on and the second switch SW2 is off, and the first band group 410 selects one of the LNAs 412_1-412_M to receive a first input signal Vin1 to generate an amplified first input signal Vin1', and the amplified first input signal Vin1' enters the first input terminal of the double balanced mixer 430, and the double balanced mixer 430 mixes the amplified first input signal Vin1' with an oscillation signal LO to generate an output signal Vout. In addition, when the second band group 420 is selected as shown in FIG. 6, the second switch SW2 is on and the first switch SW1 is off, and the second band group 420 selects one of the LNAs 422_1-422_N to receive a second input signal Vin2 to generate an amplified second input signal Vin2', and the amplified second input signal Vin2' enters the second input terminal of the double balanced mixer 430, and the double balanced mixer 430 mixes the amplified second input signal Vin2' with the oscillation signal to generate the output signal Vout.

Figure 6:
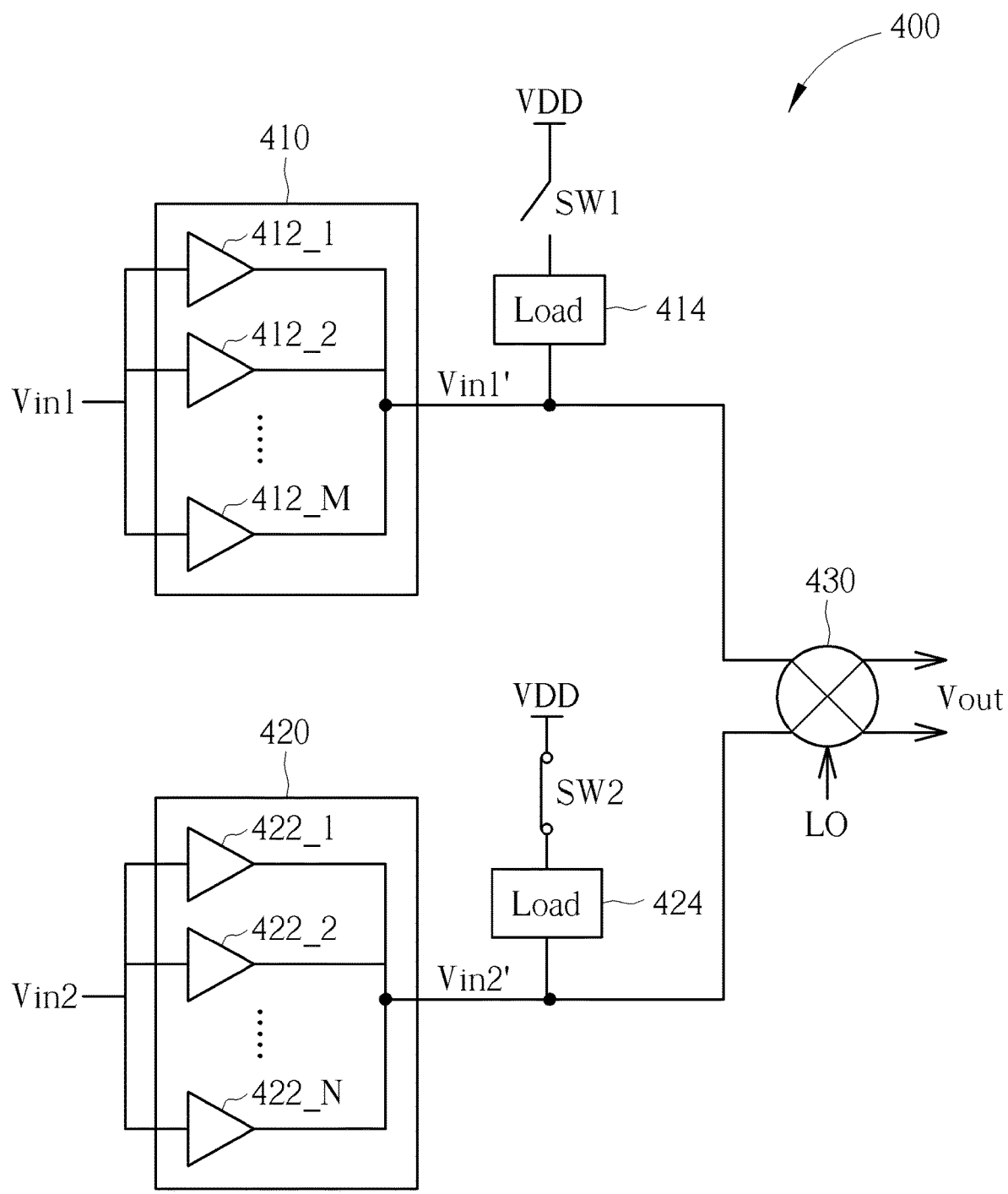
FIG. 6 shows that the second band group is selected in the receiver shown in FIG. 4.

In the embodiment shown in FIGS. 4-6, because each of the first band group 410 and the second band group 420 uses only one input terminal of the double balanced mixer 430, the signal path always suffers the parasitic load of only one of the first switch SW1 and the second switch SW2. Therefore, the signal quality is better than the conventional art.

Figure 7:
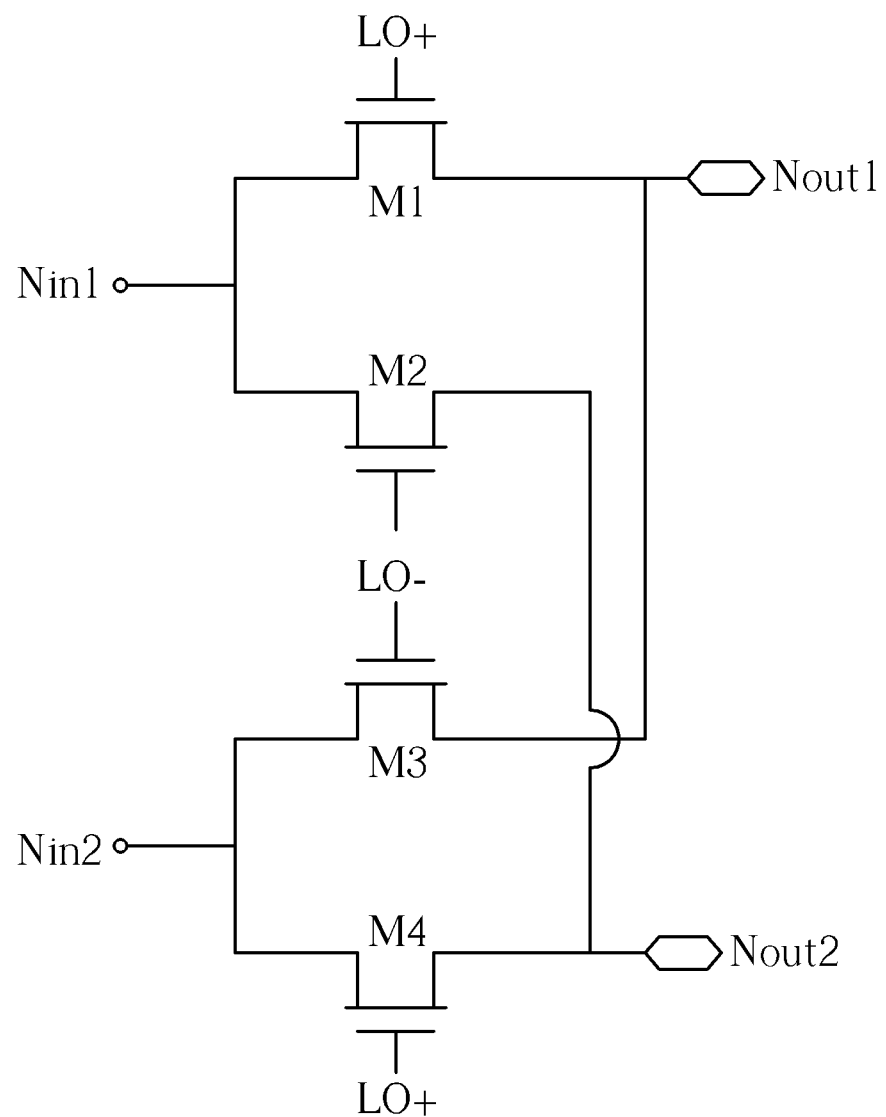
FIG. 7 is a diagram illustrating a double balanced mixer according to one embodiment of the present invention.

FIG. 7 is a diagram illustrating a double balanced mixer 700 according to one embodiment of the present invention, wherein the double balanced mixer 700 can be used to implement the double balanced mixer 130/430. As shown in FIG. 7, the double balanced mixer 700 comprises a first control switch M1, a second control switch M2, a third control switch M3, a fourth control switch M4, a first input terminal Nin1, a second input terminal Nin2, and two output terminals Nout1 and Nout2, wherein the first control switch M1 and the fourth control switch M4 are controlled by the oscillation signal LO+, and the second control switch M2 and the third control switch M3 are controlled by the oscillation signal LO−. In this embodiment, the double balanced mixer 700 can be regarded as a single balance mixer operation with the double balanced circuit structure, that is the double balanced mixer 700 receives the input signal at only one of the input terminals to generate a differential output signal. Specifically, in the operations of the double balanced mixer 700, if the first band group 110/410 is enabled, the double balanced mixer 700 receives the amplified first input signal Vin1' from the first band group 110/410 to generate a differential output signal at the output terminals Nout1 and Nout2 (at this time, the second input terminal Nin2 is opened, that is the second input terminal Nin2 does not receive any signal); and if the second band group 120/420 is enabled, the double balanced mixer 700 receives the amplified second input signal Vin2' from the first band group 120/420 to generate the differential output signal at the output terminals Nout1 and Nout2 (at this time, the first input terminal Nin1 is opened, that is the first input terminal Nin1 does not receive any signal).

Briefly summarized, in the receiver of the present invention, two band groups are coupled to two input terminals of the double balanced mixer via switches, respectively. Therefore, each signal path always suffers the parasitic load of its own switch, without being affected by the switch in another signal path, and the signal quality and the performance of the band groups will become better.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A receiver, comprising:
a first band group comprising at least one first low-noise amplifier (LNA), wherein the first band group is configured to select one first LNA to receive a first input signal to generate an amplified first input signal;
a second band group comprising at least one second LNA, wherein the second band group is configured to select one second LNA to receive a second input signal to generate an amplified second input signal; and
a mixer, wherein the first band group and the second band group are coupled to a first input terminal and a second input terminal of the mixer, respectively, and the mixer receives one of the amplified first input signal and the amplified second input signal to generate an output signal.

2. The receiver of claim 1, further comprising:
a first switch, coupled between the first band group and the first input terminal of the mixer; and
a second switch, coupled between the second band group and the second input terminal of the mixer;
wherein only one of the first switch and the second switch is enabled to transmit the amplified first input signal or the amplified second input signal to the mixer.

3. The receiver of claim 2, further comprising:
a first capacitor, coupled between the first switch and the first input terminal of the mixer.

4. The receiver of claim 3, further comprising:
a second capacitor, coupled between the second switch and the second input terminal of the mixer.

5. The receiver of claim 3, further comprising:
a second capacitor, coupled between the second band group and the second switch.

6. The receiver of claim 2, further comprising:
a first capacitor, coupled between the first band group and the first switch.

7. The receiver of claim 6, further comprising:
a second capacitor, coupled between the second band group and the second switch.

8. The receiver of claim 1, further comprising:
a first load, coupled to an output terminal of the first band group; and
a first switch, coupled between a supply voltage and the first load, for selectively connecting the supply voltage to the first load or not.

9. The receiver of claim 8, further comprising:
a second load, coupled to an output terminal of the second band group; and
a second switch, coupled between the supply voltage and the second load, for selectively connecting the supply voltage to the second load or not.

10. The receiver of claim 1, wherein the mixer is a double balance mixer comprising:
a first control switch, for selectively connecting the first input terminal of the mixer to a first output terminal of the mixer according to an oscillation signal;
a second control switch, for selectively connecting the first input terminal of the mixer to a second output terminal of the mixer according to another oscillation signal;
a third control switch, for selectively connecting the second input terminal of the mixer to the first output terminal of the mixer according to the another oscillation signal; and
a fourth control switch, for selectively connecting the second input terminal of the mixer to the second output terminal of the mixer according to the oscillation signal.

11. The receiver of claim 10, further comprising:
a first switch, coupled between the first band group and the first input terminal of the mixer; and
a second switch, coupled between the second band group and the second input terminal of the mixer;
wherein only one of the first switch and the second switch is enabled to transmit the amplified first input signal or the amplified second input signal to the mixer.

12. The receiver of claim 1, wherein the mixer comprises a double balanced mixer.

* * * * *